United States Patent
Murnane

(10) Patent No.: US 11,171,643 B1
(45) Date of Patent: Nov. 9, 2021

(54) SIC GATE DRIVE CONTROL WITH TRENCH FETS FROM HIGH DV\DT AT DRAIN SOURCE

(71) Applicant: Analog Devices International Unlimited Company, Limerick (IE)

(72) Inventor: Martin Murnane, County Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/887,600

(22) Filed: May 29, 2020

(51) Int. Cl.
*H03K 17/16* (2006.01)

(52) U.S. Cl.
CPC .................................. *H03K 17/165* (2013.01)

(58) Field of Classification Search
CPC .... H03K 17/16; H03K 17/161; H03K 17/165; H03K 17/166; H03K 17/167
See application file for complete search history.

(56) References Cited

U.S. PATENT DOCUMENTS

| 5,568,081 A * | 10/1996 | Lui ...................... | H03K 17/166 326/27 |
| 8,841,940 B2 * | 9/2014 | Barrenscheen ...... | H03K 17/165 327/108 |
| 2016/0056151 A1 * | 2/2016 | Sheridan ................ | H01L 29/16 257/76 |

OTHER PUBLICATIONS

"Agileswitch SiC MOSFET Gate Drivers", NAC Semi, [Online] Retrieved from the Internet: <URL: https://www.nacsemi.com/products/agileswitch/sicmosfetdrivers/?gclid=cngqlbbesnqcfa697qodw88plw>, (Retrieved May 28, 2020), 5 pgs.
Herring, Richard, "UCC27531 35-V Gate Driver for SiC MOSFET Applications", Texas Instruments Application Report, (May 2018), 11 pgs.
Huang, Haokai, et al., "A Switching Ringing Suppression Scheme of SiC MOSFET by Active Gate Drive", IEEE 8th Intl. Power Electronics and Motion Control Conference (IPEMC-ECCE Asia), (2016), 7 pgs.
Kinzer, Dan, et al., "GaN Matures for Industry with Monolithic Power ICs", Power Electronics Europe, Issue 2, pp. 26-28, (2016), 3 pgs.
Motonobu, Joko, et al., "Snubber circuit to suppress the voltage ringing for SiC device", PCIM Europe, Nuremberg, DE, (May 2015), 6 pgs.

* cited by examiner

*Primary Examiner* — Diana J. Cheng
(74) *Attorney, Agent, or Firm* — Schwegman Lundberg & Woessner, P.A.

(57) ABSTRACT

A switching circuit can help reduce electrical feedback ringing at a gate terminal of a transistor. The switching circuit can include a transistor circuit to switch an electrical signal and a control circuit to provide an actuation signal to the gate terminal of the transistor device. The switching circuit can also include a booster circuit that is disposed between the control circuit and the gate terminal of the transistor device. The booster circuit can be configured to detect a signal from the control circuit to turn off the transistor device and, responsive to the detected signal, drive a current into the gate terminal of the transistor device for a specified span of time before the transistor device turns off.

19 Claims, 5 Drawing Sheets

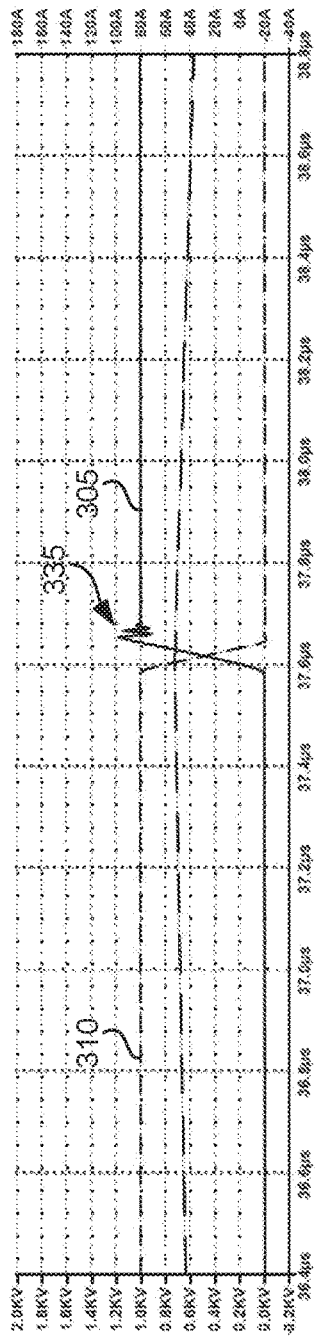 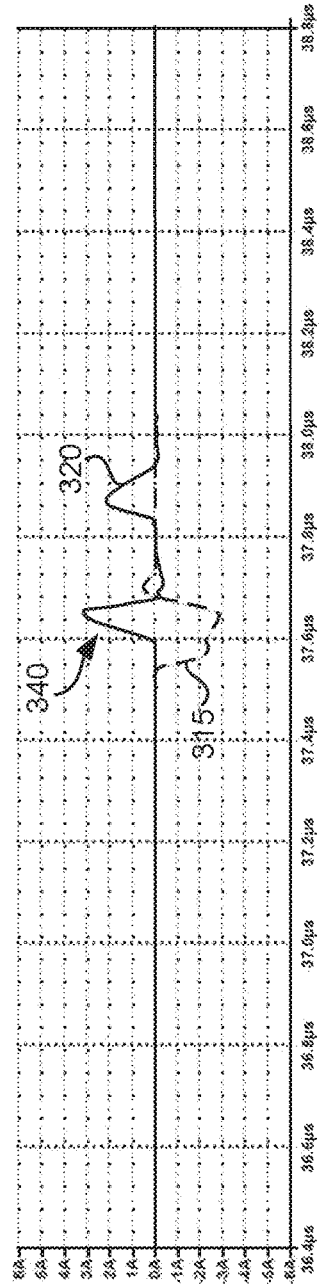 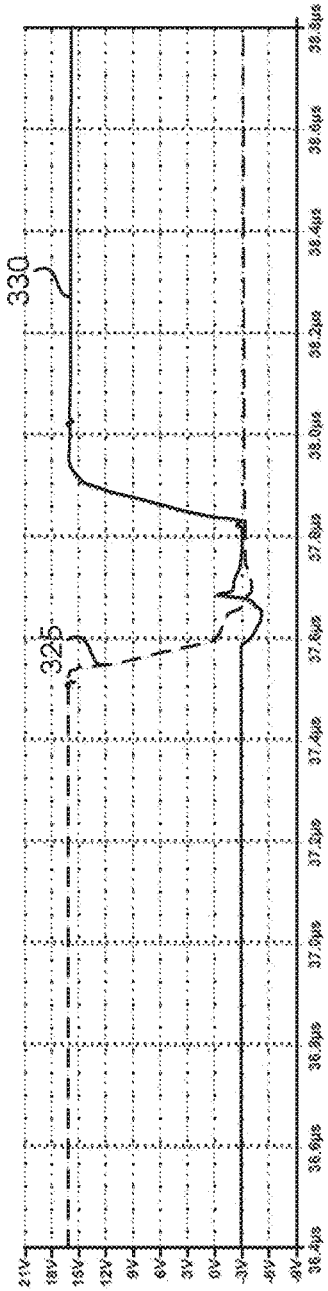
FIG. 3A
FIG. 3B
FIG. 3C

SIC GATE DRIVE CONTROL WITH TRENCH FETS FROM HIGH DV\DT AT DRAIN SOURCE

FIELD OF THE DISCLOSURE

This document pertains generally, but not by way of limitation, to the control of high voltage switching devices to reduce ringing caused by feedback signals generated by high speed switching.

BACKGROUND

Electronic systems that incorporate high voltage switching circuits, such as switched power converters, can use switching devices to condition electrical power for use by other circuits. Such switching devices can include field effect transistors (FETs), such as silicon carbide field effect transistors (SiC FETs), that are configured to controllably switch large voltages at high speeds. In an example, a SiC FET can be driven by a gate driver circuit to switch a high voltage signal (e.g., a signal having a voltage magnitude of at greater than 1000 volts (V) between the drain and source terminals of the transistor with switching times that are on the order of a few nanoseconds (ns) or faster. An example of a SiC FET includes a trench FET, such as described in U.S. Pat. No. 7,595,238B2 to Takashi Tsuji which issued Sep. 29, 2009.

SUMMARY OF THE DISCLOSURE

An example of the present disclosure includes a switching circuit to reduce electrical feedback ringing at a gate terminal of a transistor. The switching circuit can include a transistor circuit to switch an electrical signal, a control circuit to provide an actuation signal to the gate terminal of the transistor device, and a booster circuit that is disposed between the control circuit and the gate terminal of the transistor device. The booster circuit can be arranged to detect a signal from the control circuit to turn off the transistor device and, responsive to the detected signal, drive a current into the gate terminal of the transistor device for a specified span of time before the transistor device turns off.

Another example of the present disclosure includes method for controlling a field effect transistor (FET) to reduce electrical feedback ringing a gate terminal of the FET. The method can include detecting a control signal to switch the FET from an on-state to an off-state and driving, responsive to detecting the control signal, a first current into the gate terminal while a voltage on the gate terminal is greater than an indicated threshold voltage. The method can further include sinking a second current from the gate terminal to turn off the FET when the voltage on the gate terminal falls below the threshold voltage.

A further example of present disclosure includes a system for reducing electrical feedback ringing a gate terminal of a FET. The system can include means for detecting a control signal to switch the FET from an on-state to an off-state and means for driving, responsive to detecting the control signal, a first current into the gate terminal while a voltage on the gate terminal is at least as high as an indicated threshold voltage. The system can further include means for sinking a second current from the gate terminal to turn off the FET when the voltage on the gate terminal falls below the threshold voltage.

This summary is intended to provide an overview of subject matter of the present patent application. It is not intended to provide an exclusive or exhaustive explanation of the embodiments of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 3A, 3B, and 3C are graphs illustrating an example of attenuated ringing at a transistor.

DETAILED DESCRIPTION

Figure 1:
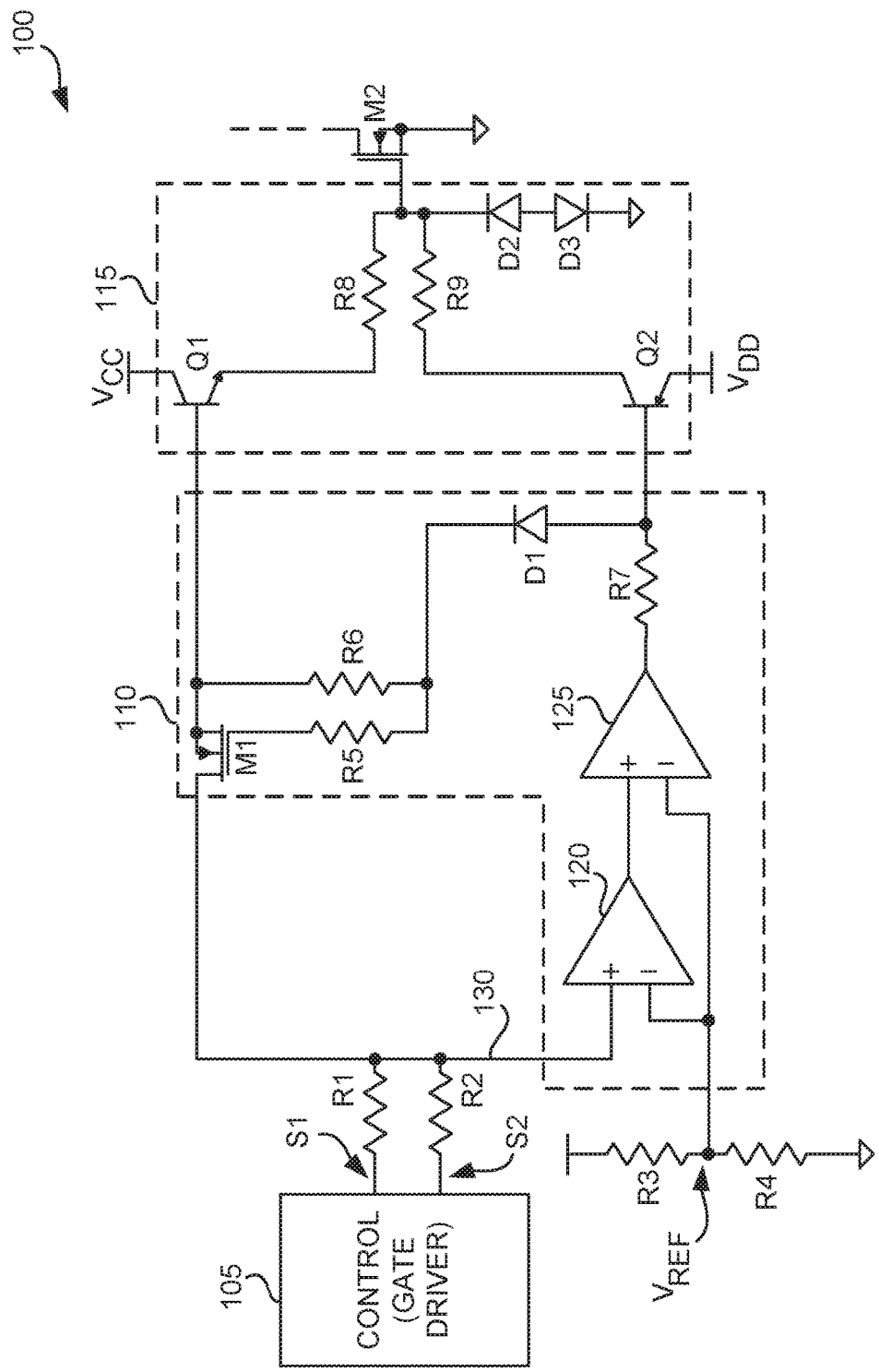
FIG. 1 is a block diagram illustrating an example of a circuit that is configured to attenuate ringing caused by feedback of an electrical signal at a transistor.

The present disclosure includes a gate driver circuit that is configured to reduce ringing at the gate of a power transistor, such as SiC FET, during high speed switching of large voltage signals. The disclosed gate driver reduces ringing feedback from the drain to the gate of the SiC FET by injecting a current into the gate of the transistor for a short span of time after the control circuit of the gate driver generates an actuation signal to drive the voltage on the gate low, such as to turn the transistor off. The disclosed gate driver improves on other gate driver circuits such as by providing a solution that can help reduce ringing in SiC FETs without inhibiting the high speed and low energy loss operation of these devices.

High voltage switching circuits, such as circuits used in power converters, can use a control circuit, such as a gate driver, to control the switching characteristics of a switching device, such as a power transistor that is configured to switch high power signals. In an example, the switching characteristics of a switching device can be controlled to convert a first power source that is generated by a first circuit to a second power source that is usable by another circuit. The efficiency of a power converter, or the power conversion process, can be characterized in terms of the amount of power loss during the conversion. The switching characteristics of the switching device, such as a switching speed and slew rate, and physical characteristics of the device, such as its "on" resistance, can affected the amount of power loss during a conversion process or during other switching operations. SiC FETs are useful as switching devices in power conversion circuit or other power switching applications, because these transistors exhibit, among other things, fast switching times, low parasitic capacitance, and relatively small on resistance.

For example, a gate driver can actuate a SiC FET, or other power FET by generating a signal to control a pullup circuit to drive a current into the gate of the transistor. The current charges the gate capacitance of the SiC FET to a threshold voltage to turn on the transistor. Similarly, a gate driver can actuate a SiC FET by generating a signal to control a pulldown circuit to sink a current from the gate of the transistor to discharge the gate capacitance, thereby turning off the transistor. The drain voltage of a SiC FET can experience a high rate change as the transistor is switched on or off. The changes or fluctuations in the drain voltage can be capacitively coupled, such as though the Miller effect, to the gate of the SiC FET and can manifest as ringing in the gate voltage. Such ringing can damage or degrade the operation of the SiC FET or circuits coupled to the transistor. Techniques for mitigating the damaging effect of such ringing can include using active clamping circuits or snubber circuits. These techniques, however, can degrade the performance of SiC FETs, such as by causing increased power loss or reduced switching speeds.

Examples of the present disclosure can include techniques (e.g., circuits, devices, systems, and methods) for reducing or preventing ringing at the gate of a SiC FET such as by temporarily reversing the flow of a current out of the gate of the SiC FET when the transistor is driven to turn off by a gate driver. In an example, a gate driver can generate a first control signal, such as a logical high signal or voltage, to control a pullup circuit to turn on a SiC FET, such as by causing the pullup circuit to drive a current into the gate of the transistor until the voltage on the gate exceeds a threshold turn on voltage. In an associated operation, the gate driver can generate a second control signals, such as a logical low signal or voltage, to control a pulldown circuit to turn the SiC FET off, such as by causing the pulldown circuit to sink a current from the gate of the SiC FET until the voltage on the gate falls below a threshold turn off voltage. The gate driver can be improved by a booster circuit that can be configured to drive a current into the gate terminal of the SiC FET until the gate to source voltage (Vgs) of the SiC FET falls below a threshold voltage. Responsive to Vgs falling below the threshold voltage, the booster circuit can stop driving the current into the gate of the SiC FET and can allow the gate driver (e.g., the pulldown circuit) to reverse the flow of current to the gate so as to sink current from the gate terminal to turn the transistor off with reduced or eliminated ringing in the gate voltage of the transistor.

FIG. 1 illustrates an example of a device 100 that is configured to attenuate ringing caused by feedback of an electrical signal at a transistor. The ringing may be generated at the gate terminal of a SiC FET by transient components of a high voltage signal (e.g., a 1000V signal) at the drain terminal of the transistor responsive to switching the transistor on or off. Such transients can exhibit large changes in voltage with respect to time, which can damage or degrade the operation of SiC FET. The device 100 can include control circuit 105, booster circuit 110, output circuit 115, and FET M2. The device 100 can also include a voltage divider circuit, such as a voltage divider formed by resistors R3 and R4, or any other suitable circuit for generating a reference voltage $V_{REF}$. The control circuit 105 can be connected to the booster circuit 110. The booster circuit 110 can be connected to the output circuit 115, and the output circuit 115 can be connected to M2. The control circuit 105, the booster circuit 110, and the output circuit 115 can be included in an integrated circuit, while M2 can be included in another circuit that is external to the integrated circuit.

The device 100 can represent an element of a switching circuit or system in which a control signal, such as a low current signal driven by an output of a microcontroller or other logic circuit, is used to drive a load, such as the gate capacitance of M2. Such switching circuits can use a gate driver, such as the gate driver circuit formed by the combination of control circuit 105, booster circuit 110, output circuit 115, or other suitable power amplifier circuit as an interface between the control signal and the load.

The FET M2 can include any FET or other transistor that is driven by a gate driver. In an example, M2 is a power transistor, such as a SiC FET.

The control circuit 105 can include any circuit that is configured to receive an input signal, such as lower-power or low current signal, and generate one or more control signals to controllably turn on and turn M2 off. For example, the control circuit 105 can include the control circuit of a MOSFET, or other power transistor, gate driver circuit. The control circuit 105 can include a FET gate driver circuit. The one or more control signals can include a first signal S1 that is configured to turn M2 on and a second signal S2 that is configured to turn M2 off. In an example, S1 and S2 can be coupled to the booster circuit 110 such as by resistors R1 and R2. The resistors R1 and R2 can include the output resistance of the control circuit 105 and may be configured in parallel to share current. The resistors R1 and R2 can be indicative of the high output impedance of the control circuit 105. In an example, the output impedance (e.g., a built-in impedance) is approximately 1 ohm. This indicates the minimum drive impedance is limited to that of the control circuit 105. In an example, S1 and S2 operate as a single control signal that is driven to a positive voltage that is suitable for turning on the bipolar transistor Q1 so as to turn M2 on. The S1 and S2 can also be driven to a low voltage that is suitable for turning on the bipolar transistor Q2 and turning off Q1, so as to turn M2 off. In another example, S1 and S2 operate as distinct control signals such that S1 is driven to a high voltage while S2 is placed in a high impedance state to turn M2 on. In this example, S2 can be driven to a low voltage while S1 is placed in a high impedance state to turn M2 off.

The booster circuit 110 can include any circuit that can be configured to detect a control signal, such as S2, to turn M2 off and, in response to detecting the control signal, drive a current into the gate of M2 for a span of time before allowing the gate of M2 to discharge and turn off the transistor. In an example, the booster circuit 110 can include amplifiers 120 and 125, FET M1, protection diode D1, current limiting resistors R5 and R7, and auto-off resistor R6.

Amplifiers 120 and 125 can each include an operational amplifier, a differential amplifier, a comparator, or similar circuit. Amplifiers 120 and 125 can be configured to transition from providing high outputs, such as voltage close to a positive supply rail of the amplifiers, to providing low outputs, such as a voltage at a negative or low supply rail of the amplifiers, responsive to a voltage at their non-inverting inputs falling below a reference voltage $V_{REF}$. In an example, the reference voltage $V_{REF}$ is determined by the voltage divider formed by R3 and R4. In another example, $V_{REF}$ is determined by any other suitable circuit, such a bandgap reference circuit, that is configured to provide a reference voltage. The amplifiers 120 and 125 can be configured so that their combined circuit provides sufficient current, output voltage, and switching speed to drive Q2 and M1 according to operational specification of the device 100. Additionally, the amplifiers 120 and 125 can be configured so that the amplifier 125 transitions from providing a high output, such as while the S1 is actuated or driven high, to providing a low output, such as after S2 is actuated or driven low, after a predetermined delay (hereinafter, "switching delay"). The switching delay is determined by the internal delays of amplifiers 120 and 125, the time it takes S2 to fall below $V_{REF}$, and by switching or propagation delays of one or more other components of the device 100.

The FET M1 can include any FET or any circuit that is configured to actuate the pullup circuit formed by Q1 to drive a current into the gate of M2 under the control of S1 and the output of amplifier 125.

The protection diode D1, the current limiting resistors R5 and R7, and the auto-off resistor R6, can each be selected using any suitable technique to limit noise generated by high speed switching, protect M1 and Q2 from damage, or to ensure the stable operation of the device 100.

The output circuit 115 can include any circuit that is configured to drive, responsive to actuation of S1 and S2 by the control circuit 105, a current into the gate of M2 so as to turn on the transistor. The output circuit 115 can include any circuit that is configured to sink a sufficient current from the gate of M2 to turn off the transistor. The output circuit 115 can include a pullup circuit, such as the pullup circuit formed by Q1, and a pulldown circuit such as the pulldown circuit formed by Q2. The output circuit 115 can include a flyback protection circuit, such as a circuit formed by resistors R8 and R9 and diodes D2 and D3. The resistors R8 and R9 and the diodes D2 and D3 can be selected using any suitable technique.

In an example of operation of the device 100, the reference voltage $V_{REF}$ is lower than the actuated voltage of S1 and higher than the threshold voltage for turning M2 off. For example, the operation of the device 100 can be characterized to determine a value of $V_{REF}$ that attains a target amount of ripple suppression at the gate of M2. Such characterization can include operating the device 100 while adjusting the ratio of R3 to R4 until a sufficient ripple suppression is obtained at the gate of M2 or until a suitable switching delay is determined. In an example, a value of $V_{REF}$ can be determined from predetermined characterization information for the device 100.

In operation, the control circuit 105 provides a first output signal, such as S1, to turn M2 on. Providing such output signal can include tri-stating S2, such as by assigning S2 a high impedance signal or value and driving S1 high. The cascaded combination of amplifiers 120 and 125 turns Q2 off and turns M1 on. The FET M1, in the on state, couples S1 to the gate of Q1, which turns Q1 on. The bipolar transistor Q1 drives a current from the power source $V_{CC}$ into the gate of M2 to turn on the FET. The control circuit 105 can provide a second output signal, such as S2, to turn M2 off. Providing the second output signal can include tri-stating S1 and driving S2 low. Although the control circuit 105 drives S2 low, it takes finite amount of time for the voltage on net 130 to fall. The output of each of amplifiers 120 and 125 will be high for a time (e.g., a first delay), including the time it takes the voltage on net 130 (e.g., S1) to fall below $V_{REF}$. After the voltage on net 130 falls below $V_{REF}$, the output of amplifier 120 will go low after a delay (e.g., 20 nanosecond, ns, delay) determined by the internal circuit or propagation delay of amplifier 120. After another delay (e.g., a third delay) determined by the internal circuit of amplifier 125 (e.g. another 20 ns), the output of amplifier 125 goes low. The FET M2 begins to turn off during the span of time including the first delay, the second delay, and the third delay. The booster circuit 110 keeps M1 turned on during this span of time, causing current to be driven though Q1 into the base of M2. The FET M1 turns off a short time after amplifier 125 turns off, thereby inhibiting the flow of current into the gate of M2 and allowing M2 to fully turn off by discharging the charge on the gate of M2 through Q2. The current driven into the gate of M2 while M2 begins to turn off, reducing ringing at the gate of M2 when the FET is turned off.

Figure 2A:
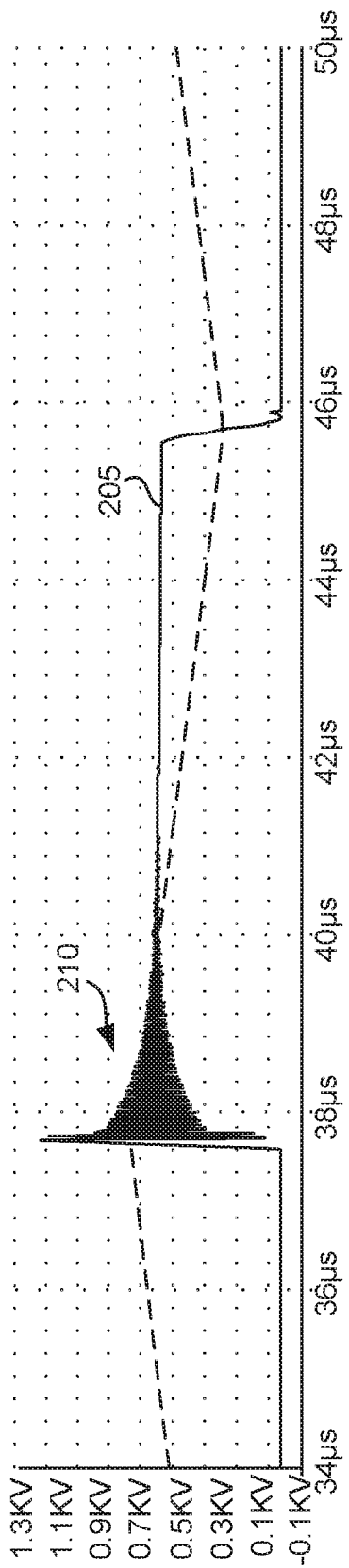
FIGS. 2A and 2B are graphs illustrating an example of ringing caused by feedback of an electrical signal at a transistor from a drain terminal to a gate terminal.
Figure 2B:
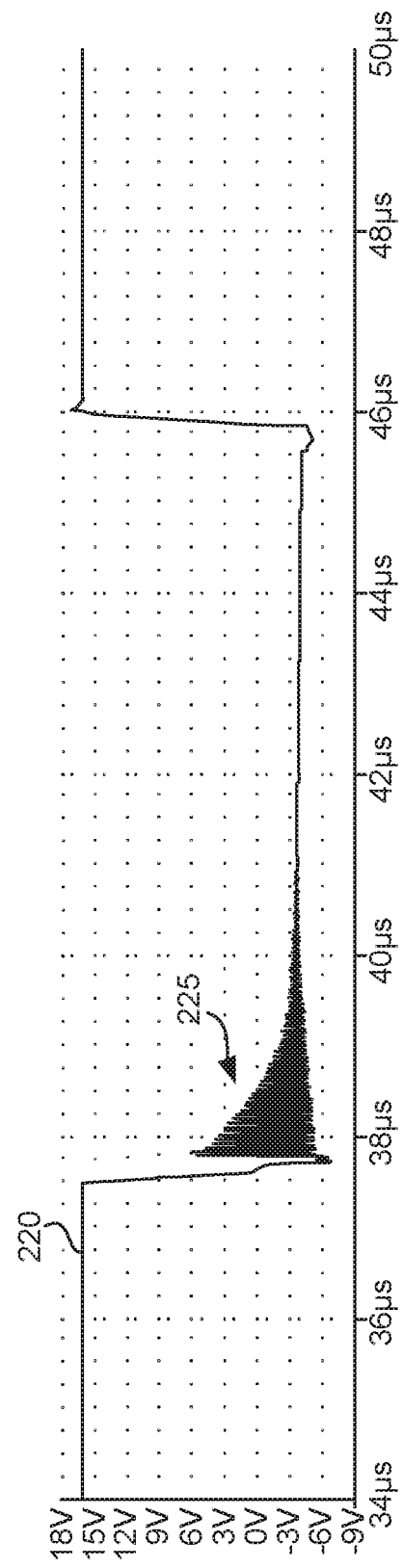

FIGS. 2A and 2B illustrate an example of ringing caused by feedback of an electrical signal at a transistor, such as the FET M2 shown in FIG. 1. FIG. 2A shows a diagram of the drain voltage 205 of the transistor, while FIG. 2B shows a diagram of the gate voltage of the transistor. As shown in the figures, the ringing 225 at the gate of the transistor is caused by transients 210 at the drain of transistor, fed back to the gate, in the frequency range of approx. 30 Mhz. In an example, the transients 210 are high voltage transients generated by operating the transistor to switch a high voltage signal, such a drain voltage 205 having a magnitude of 1200V, at a high speed, such as at 3 ns switching times or periods. In an example, the high output impedance of a driver circuit, such as an impedance of one ohm or greater output impedance of the control circuit 105, makes it difficult prevent or limit the ringing 225.

FIGS. 3A, 3B, and 3C illustrate an example of attenuated ringing at a transistor, such as using the techniques described herein. In an example, the transistor is a FET, such as M2. FIG. 3A depicts a plot of rising drain voltage 305 as the transistor is switched off superimposed over a plot of falling drain voltage 310 as the transistor is switched on. FIG. 3B depicts a plot of current at the gate of the transistor when the transistor is switched off 315 superimposed over a plot of current at the gate of the transistor when the transistor is switched on 320. FIG. 3C depicts a plot of falling gate voltage 325 as the transistor is switched off superimposed over a plot of rising gate voltage 330 as the transistor is switched on. The transistor described in FIGS. 3A, 3B, and 3C is operated under substantially similar conditions as the transistor described in the discussion of FIGS. 2A and 2B, with the exception that the transistor described in FIGS. 3A, 3B, and 3C is driven to turn off as described herein. In an example, the transistor is driven according to the device 100, such that a current 340 is driven into the gate of the transistor for a short time after the transistor is actuated or commanded to turn off by the control circuit 105. As shown in FIGS. 3A, 3B, and 3C, transients 335 at the drain of the transistor are suppressed at, or are not coupled to, the gate of the transistor. The suppression of such transients is indicative of reduced ringing at the gate of the transistor. Such reduced ringing is caused by temporarily driving current into the gate of the transistor after the transistor is commanded to turn off but before the device actually turns off, such as described herein.

Figure 4:
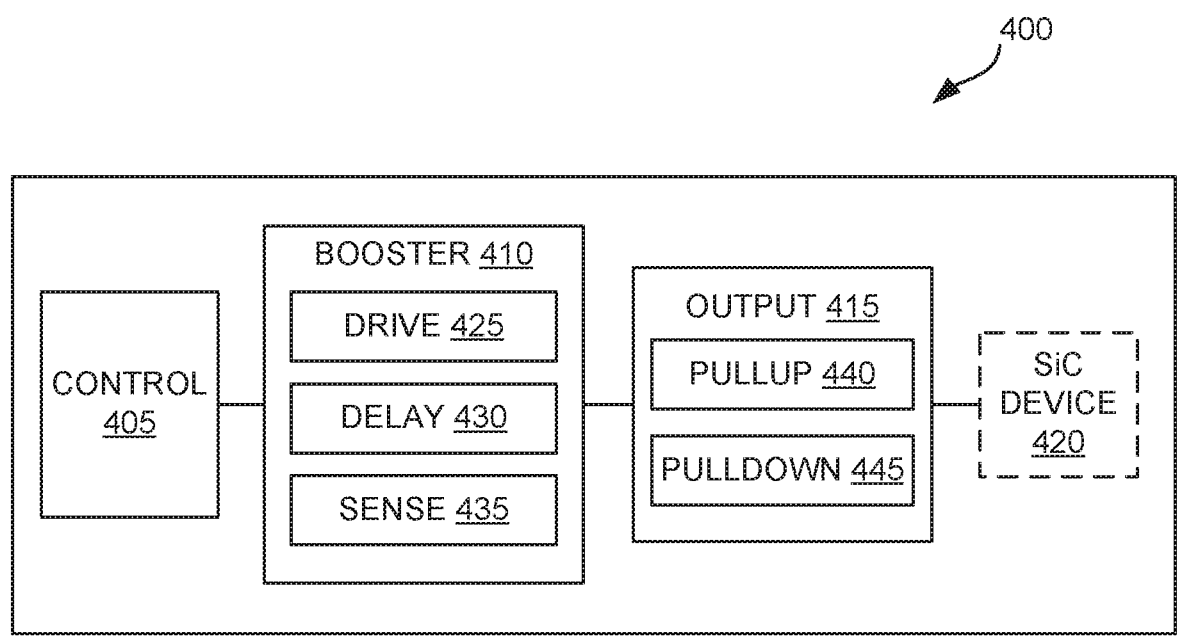
FIG. 4 is a block diagram illustrating an example of a device that includes a switching circuit that is configured to reduce ringing caused by feedback of an electrical signal at a transistor.

FIG. 4 illustrates an example of a device 400 that includes a switching circuit that is configured to reduce ringing caused by feedback of an electrical signal at a transistor. In an example, the device 400 includes one or more components of the device 100 shown in FIG. 1. In an example, the device 400 includes control circuit 405 that is analogous to the control circuit 105, a booster circuit 410 that is analogous to the booster circuit 110, and an output circuit that is analogous to the output circuit 115. In an example, the device 400 also includes a transistor 420 that is analogous to the FET M2. In an example, the transistor 420 is a power transistor, such as a SiC FET.

The control circuit 405 can include any circuit that is configured to generate one or more control signals, such as S1 and S2 of FIG. 1, to turn the transistor 420 on or to turn the transistor 420 off.

The booster circuit 410 can include any circuit that is configured to detect a control signal from the control circuit 405 to turn the transistor 420 off and, responsive to detecting the signal, temporarily drive a current into the gate of the transistor 420, such as for a time determined by the amount of time it takes for the control signal or the voltage on the gate of the transistor 420 to fall below a threshold voltage. The threshold voltage can be determined by characterizing the operation of the device 400 for a specific application, such as for a specific configuration of the components of the device 400, a switching rate of the transistor 420, or a signal switched by the transistor. The booster circuit 410 can include a drive circuit 425, a delay circuit 430, and a sensing circuit 435. The drive circuit 425 can include one or more circuits that are configured to control the output circuit 415, such as by providing a current to drive the pullup circuit 440 and the pulldown circuit 445, to temporarily drive the current into the gate of the transistor 420. The drive circuit 425 can include the FET M1 and supporting circuitry. The delay circuit 430 can include one or more circuits that are configured to determine the amount of time during which current is driven into the gate of the transistor 420, such as after the control circuit commands the transistor to turn off. In an example, the delay circuit 430 includes at least the amplifier 120 or 125 and a voltage reference circuit, such as the voltage divider formed by resistors R3 and R4. The sensing circuit 435 can include one or more circuits that are configured to detect the control signal or the voltage at the gate of transistor 420 falling to or below a threshold voltage, such as described herein. The sensing circuit 435 can include the voltage divider formed by R3 and R4, and the amplifier 120 or 125, as shown in FIG. 1.

The output circuit 415 can include any circuit that is configured to source or sink sufficient current to turn transistor 420 on or to turn transistor 420 off. The output circuit 415 can include a pullup circuit 440, such as formed by Q1 in FIG. 1, and pulldown circuit 445, such as formed by Q2.

Figure 5:
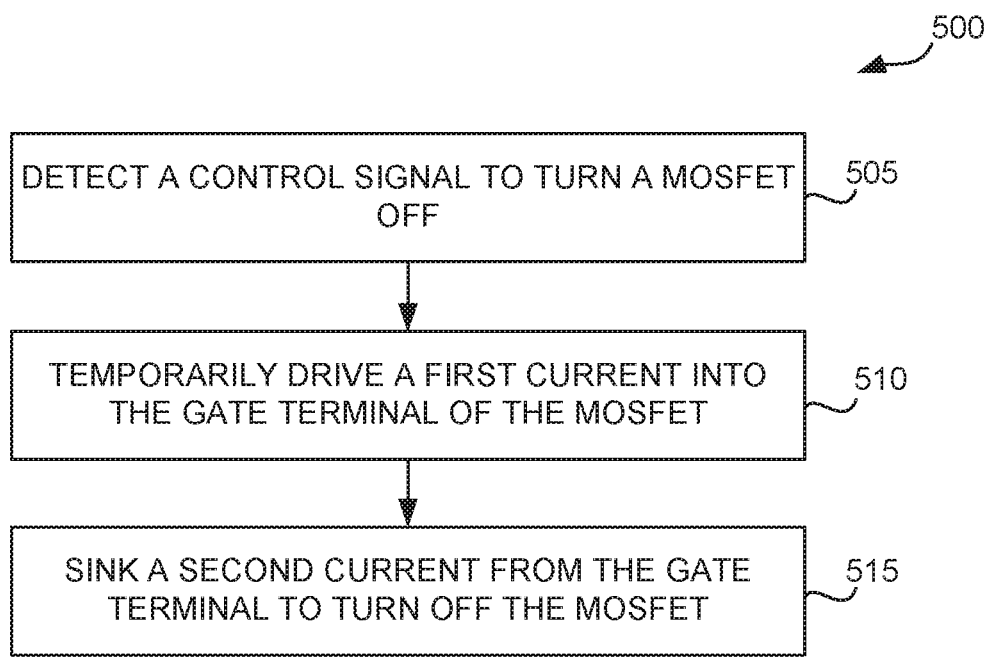
FIG. 5 is a flow chart illustrating an example of a method of operating a circuit to attenuate ringing caused by feedback of an electrical signal at a transistor.

FIG. 5 illustrates an example of a set of operations 500 such as for operating a circuit to attenuate or reduce ringing caused by feedback of an electrical signal at a transistor. The transistor can include a power transistor, such as SiC MOFSET such as the FET M2 showing in FIG. 1 or the transistor 420 shown in FIG. 4. The operations 500 can be executed or implemented in any of the techniques described herein.

At 505, a control signal, such as the signal S2 that is generated by the control circuit 105 in FIG. 1, can be detected. The control signal can be configured to switch the transistor from an on-state to an off-state. At 510, responsive to detecting the control signal, a first current can be driven into a gate (or other control terminal) of the transistor. The first current can be driven into the gate terminal while a voltage on the gate terminal is higher than a first threshold voltage. The first threshold voltage can be a voltage at which a sufficient amount current is driven into the gate terminal to reduce ringing at the gate below a threshold voltage level. Driving the first current into the gate terminal can include driving the first current into the gate terminal for an indicated span of time after detecting the control signal or after the control signal is actuated. The indicated span of time can be selected to allow enough time for the voltage on the gate terminal to fall below the first threshold voltage. The indicated span of time, or the tolling of the indicated span of time, can be at least partially determined, or triggered based, on detecting the voltage of the control signal fall below a second threshold voltage. At 515, a second current can be sunk from the gate terminal to turn the transistor off. For example, the second current can be sunk responsive to expiration of the indicated span of time. In an example, the second current is sunk responsive to detecting that the voltage on the gate terminal of the transistor is below the first threshold voltage.

The set of operations 500 can include any other operation that is suitable for implementing the techniques described herein.

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific embodiments in which embodiments of the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of embodiments of the invention should be determined with reference to the appended claims, along with the full scope of equivalents to which such claims are entitled.

The claimed invention is:

1. A switching circuit to reduce electrical feedback ringing at a gate terminal of a transistor, the switching circuit comprising:
   a transistor circuit to switch an electrical signal;
   a control circuit to provide an actuation signal to the gate terminal of the transistor circuit; and
   a booster circuit that is disposed between the control circuit and the gate terminal of the transistor circuit, the booster circuit arranged to:
   detect a signal from the control circuit to turn off the transistor circuit; and
   responsive to the detected signal;
      drive a first current into the gate terminal of the transistor circuit for a specified span of time before the transistor circuit turns off, and
      sink a second current from the gate terminal of the transistor circuit responsive to expiration of the specified span of time.

2. The switching circuit of claim 1, further comprising:
   a delay circuit that is configured to determine the specified span of time based on the detected signal and a reference signal.

3. The switching circuit of claim 2, wherein the delay circuit comprises an amplifier circuit that is configured to compare the detected signal to the reference signal and generate a delay signal to control the current driven into the gate terminal of the transistor.

4. The switching circuit of claim 3, further comprising:
   an output stage comprising a pullup circuit and a pulldown circuit; and
   a second transistor that is configured to couple the actuation signal that is generated by the control circuit to a control terminal of the pullup circuit, the second transistor actuated by the delay signal generated by the amplifier circuit.

5. The switching circuit of claim 4, wherein the output stage further comprises a pulldown circuit that is configured to sink a current from the gate terminal of the transistor, the pulldown circuit actuated by the delay signal generated by the amplifier circuit.

6. The switching circuit of claim 1, wherein the transistor is a field effect transistor (FET) that is configured to switch a signal of that has a voltage amplitude of least 1000 volts.

7. The switching circuit of claim 1, wherein the transistor is a silicon carbide device FET.

8. A method for controlling a field effect transistor (FET) to reduce electrical feedback ringing at a gate terminal of the FET, the method comprising:
   detecting a control signal to switch the FET from an on-state to an off-state;
   driving, responsive to detecting the control signal, a first current into the gate terminal while a voltage on the gate terminal is greater than an indicated threshold voltage; and
   sinking a second current from the gate terminal to turn off the FET responsive to the voltage on the gate terminal falling below the indicated threshold voltage.

9. The method of claim 8, wherein driving the first current into the gate terminal while a voltage on the gate terminal is greater than an indicated threshold voltage comprises driving the first current into the gate terminal for an indicated span of time, the indicated span of time being at least long enough to enable the voltage on the gate terminal to fall below the indicated threshold voltage.

10. The method of claim 9, further comprising determining the indicated span of time based on detecting a voltage of the control signal falling below a second threshold voltage.

11. The method of claim 9, further comprising determining the indicated span of time based on a propagation delay though a least an amplifier circuit or a comparator circuit.

12. The method of claim 9, wherein sinking the second current from the gate terminal to turn off the FET responsive to the voltage on the gate terminal falling below the indicated threshold voltage comprises controlling a pulldown circuit to sink the second current from the gate terminal into a negative rail of a power source responsive to expiration of the indicated span of time.

13. The method of claim 8, wherein sinking the second current from the gate terminal to turn off the FET responsive to the voltage on the gate terminal falling below the indicated threshold voltage comprises:
   detecting the voltage on the gate terminal fall below the indicated threshold voltage; and
   controlling, responsive to detecting the voltage on the gate terminal fall below the indicated threshold voltage, a pulldown circuit to sink the second current from the gate terminal into a power supply rail.

14. The method of claim 8, wherein driving the first current into the gate terminal while a voltage on the gate terminal is greater than an indicated threshold voltage comprises controlling a pullup circuit to drive the first current into the gate terminal from a positive rail of a power source.

15. A system for reducing electrical feedback ringing a gate terminal of a field effect transistor (FET), the system comprising:
   means for detecting a control signal to switch the FET from an on-state to an off-state;
   means for driving, responsive to detecting the control signal, a first current into the gate terminal while a voltage on the gate terminal is at least as high as an indicated threshold voltage; and
   means for sinking a second current from the gate terminal to turn off the FET responsive to the voltage on the gate terminal falling below the indicated threshold voltage.

16. The system of claim 15, further comprising:
   means for determining that the voltage on the gate terminal is below the indicated threshold voltage.

17. The system of claim 16, wherein the means for determining that the voltage on the gate terminal is below the indicated threshold voltage comprises means for determining a span of time for driving the first current into the gate terminal.

18. The system of claim 16, further comprising:
    means for controlling, responsive to detecting the voltage on the gate terminal fall below the indicated threshold voltage, a pulldown circuit to sink the second current from the gate terminal into a power supply rail.

19. The system of claim 15, wherein the means for driving the first current into the gate terminal while a voltage on the gate terminal is greater than the indicated threshold voltage comprises means for controlling a pullup circuit to drive the first current into the gate terminal from a positive rail of a power source.

\* \* \* \* \*